(12) United States Patent
Joshi et al.

(10) Patent No.: US 12,096,606 B2
(45) Date of Patent: Sep. 17, 2024

(54) HYBRID COOLING SYSTEMS FOR ELECTRIC MACHINES

(71) Applicant: TOYOTA MOTOR ENGINEERING & MANUFACTURING NORTH AMERICA, INC., Plano, TX (US)

(72) Inventors: Shailesh N. Joshi, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 246 days.

(21) Appl. No.: 17/704,743

(22) Filed: Mar. 25, 2022

(65) Prior Publication Data

US 2023/0309277 A1  Sep. 28, 2023

(51) Int. Cl.
*H05K 7/20* (2006.01)
*H02K 9/06* (2006.01)

(52) U.S. Cl.
CPC .......... *H05K 7/20927* (2013.01); *H02K 9/06* (2013.01); *H05K 7/20254* (2013.01); *H05K 7/20263* (2013.01); *H05K 7/20272* (2013.01)

(58) Field of Classification Search
None
See application file for complete search history.

(56) References Cited

U.S. PATENT DOCUMENTS

| 8,774,982 | B2 | 7/2014 | Oakley et al. | |
| 9,914,537 | B2 | 3/2018 | Wu et al. | |
| 11,560,235 | B2* | 1/2023 | Wagner | B64D 33/08 |
| 11,794,913 | B2* | 10/2023 | Lacaux | B60L 15/20 |
| 11,848,588 | B2* | 12/2023 | Pae | H02K 11/30 |
| 2014/0340004 | A1* | 11/2014 | Flett | H02P 7/06 318/139 |
| 2021/0313919 | A1* | 10/2021 | Takahashi | H02P 29/027 |
| 2021/0320554 | A1* | 10/2021 | Wu | H02K 5/225 |
| 2022/0094297 | A1* | 3/2022 | Lacaux | H02P 27/06 |
| 2022/0402364 | A1* | 12/2022 | Khozikov | B60L 3/04 |

FOREIGN PATENT DOCUMENTS

| CN | 106697297 B | 5/2017 |
| CN | 107089342 A | 8/2017 |
| WO | 2016142555 A1 | 9/2016 |

* cited by examiner

*Primary Examiner* — Courtney L Smith
(74) *Attorney, Agent, or Firm* — DINSMORE & SHOHL LLP

(57) ABSTRACT

A hybrid cooling system of an electric machine is contemplated. The hybrid cooling system includes a propeller assembly comprising a propeller, a housing comprising a stator and a rotor coupled to the propeller, and one or more capacitors, a gate drive electronics board, a cold plate, a substrate, power electronics coupled to substrate and the cold plate, a pump for pumping liquid coolant, and a heat exchanger. The liquid coolant from the pump contacts the gate drive electronics board, the cold plate, the substrate, and the power electronics for cooling the gate drive electronics board, the cold plate, the substrate, and the power electronics, and the propeller is configured to generate air that cools the stator and the rotor.

15 Claims, 3 Drawing Sheets

HYBRID COOLING SYSTEMS FOR ELECTRIC MACHINES

TECHNICAL FIELD

The embodiments described herein generally relate to a hybrid cooling system, and in particular, to the hybrid cooling system in the form of a propeller assembly having the capabilities to cool various components disposed within the assembly using a combination of a liquid coolant released by a pump and air generated by the propeller.

BACKGROUND

Electric vertical take-off and landing (eVTOL) vehicles may take off from a source location, e.g., with cargo in the form of purchased goods, for delivery to a location, travel a certain distance in the air, drop off the cargo, and return to the destination location. Operation of eVTOL vehicles, however, suffer from deficiencies. For example, during take-off and landing operations, components included within the eVTOL vehicles may experience sudden increases in operating temperatures due to increased power demands, which adversely impact the operational life of these components, and by extension, the operational life of eVTOL vehicles.

Accordingly, a need exists for alternative cooling systems that cools the stator, motor, and various components of the eVTOL vehicles during various vehicle operating conditions.

SUMMARY

In one embodiment, a hybrid cooling system of an electric machine provided. The hybrid cooling system includes a propeller assembly comprising a propeller, a housing comprising a stator and a rotor coupled to the propeller, and one or more capacitors, a gate drive electronics board, a cold plate, a substrate, power electronics coupled to substrate and the cold plate, a pump for pumping liquid coolant, and a heat exchanger. The liquid coolant from the pump contacts the gate drive electronics board, the cold plate, the substrate, and the power electronics for cooling the gate drive electronics board, the cold plate, the substrate, and the power electronics, and the propeller is configured to generate air that cools the stator and the rotor.

In another embodiment, another hybrid cooling system of an electric machine is provided. The hybrid cooling system comprises a propeller assembly comprising a propeller, and a housing comprising a stator and a rotor coupled to the propeller, and one or more capacitors, a gate drive electronics board, a cold plate, a substrate, power electronics coupled to substrate and the cold plate, a pump for pumping liquid coolant, and a heat exchanger. The liquid coolant from the pump contacts the gate drive electronics board, the cold plate, the substrate, and the power electronics for cooling the gate drive electronics board, the cold plate, the substrate, and the power electronics, and the propeller is configured to generate air that cools the stator and the rotor.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Electric vertical take-off and landing vehicles may provide a way of delivering goods to various locations in a cost and energy efficient manner. However, as stated above, eVTOL vehicles suffer from a deficiency. During specific operating conditions such as, e.g., take-off, landing, and hovering, the operating temperatures of the components within eVTOL vehicles may exceed threshold operational temperatures, namely threshold operational temperatures that are considered suitable for ensuring long operational life for these components.

The embodiments described herein address and overcome the above described deficiency. In particular, the embodiments of the present disclosure provide a hybrid cooling system of an electric machine (e.g., eVTOL vehicle) that utilizes air generated by rotation of a propeller of the electric machine and a liquid coolant circulated by a pump positioned within electric machine to cool a plurality of components within the electric machine, namely, e.g., a stator, a rotor, a gate drive board, a cold plate, a substrate, power electronics, and a controller. Further, it is noted that the liquid coolant that heats up upon contacting each of the components of the eVTOL vehicle may be cooled with the air generated by the rotation of the propeller of the vehicle, after which the cooled liquid may be channeled into a heat exchanger that discharges the liquid from the eVTOL vehicle. Additionally, in embodiments, additional liquid coolant may be channeled from the heat exchanger along a path to the pump for performing additional cooling of the plurality of components of the eVTOL vehicle. A benefit of the arrangement as described in the present disclosure is that the propeller, which will be continuously in operation whenever the eVTOL vehicle is airborne or operating in any capacity, provides a steady flow of air that cools various components of the eVTOL vehicle, namely the stator, the rotor, a gate drive board, a cold plate, a substrate, power electronics, and a controller.

Figure 1A:
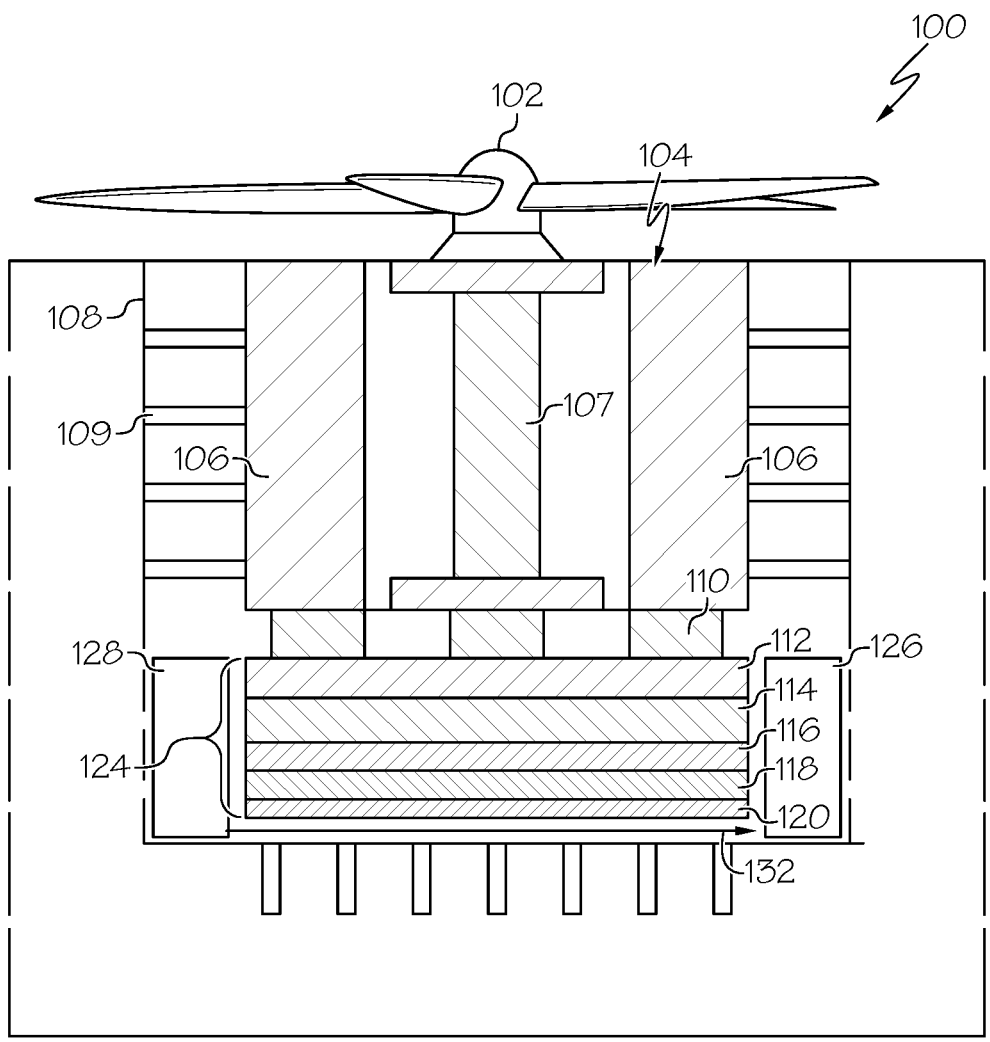
FIG. 1A depicts an example implementation of a hybrid cooling system included as part of an electric machine in the form of an eVTOL vehicle, according to one or more embodiments described and illustrated herein.

FIG. 1A depicts an example implementation of a hybrid cooling system included as part of an eVTOL vehicle 100, according to one or more embodiments described and illustrated herein. The eVTOL vehicle 100 refers to an aircraft that is capable of traveling in the air, or in the air and on land, using primarily or exclusively electric power. In embodiments, the eVTOL vehicle 100 may include propellers positioned on wings that protrude from the sides and a rear portion of the eVTOL vehicle 100. The eVTOL vehicle 100 also includes an electric motor assembly 104 that comprises a stator 106 and a rotor 107. The stator 106 and the rotor 107 may be coupled to the propeller 102, and the electric motor assembly 104 may be disposed within the housing 108. In embodiments, the housing 108 may include a plurality of additional components such as, e.g., capacitors 110, a gate drive board 112, a cold plate 114, a substrate 116, power electronics 118, and a controller 120. The housing 108 further includes a pump 126 and a heat exchanger 128, and a plurality of fins 109 disposed on exterior portions of the housing 108.

In embodiments, the various components may be arranged in a particular order within the housing 108 of the eVTOL vehicle 100 in order to ensure that these components are effectively coupled. For example, in embodiments, the stator 106 and the rotor 107 may be positioned in a top portion of the housing 108 and a plurality of fins 109 may be positioned or disposed on an outer boundary of the stator 106 and the rotor 107. The capacitors 110 may be positioned underneath the stator 106 and the rotor 107. Additionally, a set of the four distinct components (hereinafter also referred to as "a power assembly 124") of the gate drive board 112, the cold plate 114, the substrate 116, and the power electronics 118 may be mechanically and electrically coupled to each other such that the cold plate 114 may be positioned underneath the gate drive board 112 and the substrate 116 may be mechanically and electrically coupled to the bottom portion of the cold plate 114. In embodiments, the power electronics 118 may be mechanically and electrically coupled to the substrate 116. In embodiments, a controller 120 may be positioned underneath the power electronics 118 and may be mechanically and electrically coupled to the power electronics 118. It is noted that while the controller 119 may be a component that is separate and distinct from the power electronics 118, as illustrated in FIG. 1. Alternatively, the controller 119 may be integrated as part of the power electronics 118.

In embodiments, as illustrated in FIG. 1, the pump 126 may be positioned on a side of the power assembly 124 and the heat exchanger 128 may be positioned on another side of the power assembly 124. It is noted however, that the position and orientation of the heat exchanger 128 and the pump 126 may be altered. Additionally, in embodiments, it is also noted that the positions of each of the components relative to one another, namely the positions of the gate drive board 112, the cold plate 114, the substrate 116, and the power electronics 118 may be altered. It is noted that, as stated above, during various operating conditions such as take-off, landing, and hovering operations, the operating temperatures of the power assembly 124 may meet or exceed particular threshold temperatures, thereby adversely affecting the operational life of each of the components in the power assembly 124.

To ensure that the operating temperatures are reduced, in real time, a hybrid cooling process may be initiated. For example, in embodiments, the hybrid cooling process may involve the use of a liquid coolant that is pumped out of the pump 126. The pumped liquid coolant may exit the pump 126 and directly contact the components in the power assembly 124, namely during high density operations of these components, as a result of which the operating temperatures of these components may be reduced below particular threshold temperatures. In embodiments, air may be generated, by the rotation of the propeller 102 and channeled onto the fins 109 disposed on the stator 106. The air generated by the propeller 102 may cool the operating the stator 106 and the rotor 107. Additionally, the air generated by the propeller 102 may contact the components of the power assembly 124, namely the gate drive board 112, the cold plate 114, the substrate 116, the power electronics 118, and the controller 120 to further cool each of these components. As such, in operation, both the air generated by the propeller 102 and the liquid coolant pumped by the pump 126 may be utilized to cool each of these components.

It is further noted that the liquid coolant, upon contacting each of the components of the power assembly 124, may experience a sudden temperature increase. In embodiments, the air generated by the propeller 102, which may enter the housing 108, e.g., via apertures located in various parts of the housing, may contact the heated liquid in order to cool it. Thereafter, the heated liquid that is cooled may be channeled into the heat exchanger 128, which discharges the liquid outside the housing 108. In embodiments, liquid coolant may be fed into the pump 126 by the heat exchanger 128 along path 132.

Figure 1B:
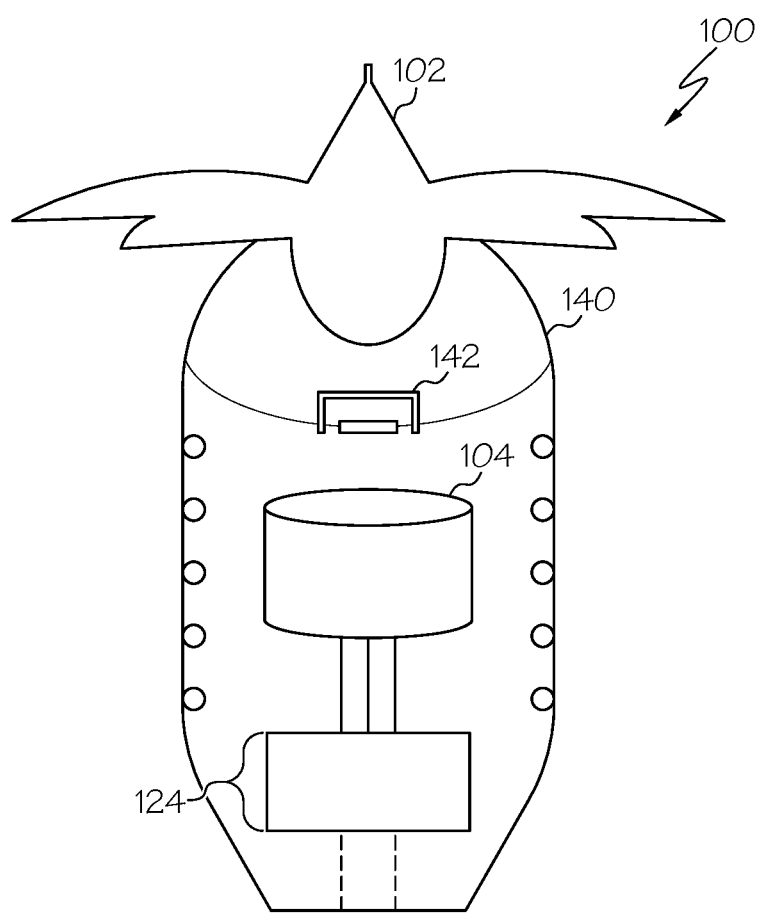
FIG. 1B depicts another illustration of the orientation of the various components of the electric machine illustrated in FIG. 1A, according to one or more embodiments described and illustrated herein.

FIG. 1B depicts another illustration of the orientation of the various components of the eVTOL vehicle 100 illustrated in FIG. 1A, according to one or more embodiments described and illustrated herein. In embodiments, the eVTOL vehicle 100 includes the propeller 102 mounted on an exterior frame 140 of the eVTOL vehicle 100, and the interior portion of the eVTOL vehicle 100 includes a gearbox 142 that is mechanically and electrically coupled with the electric motor assembly 104, which is positioned underneath the propeller 102 and the gearbox 142. Additionally, the power assembly 124 may be positioned underneath the electric motor assembly 104 and, as stated above, the power assembly 124 may be electrically and mechanically coupled with the electric motor assembly 104.

Figure 2:
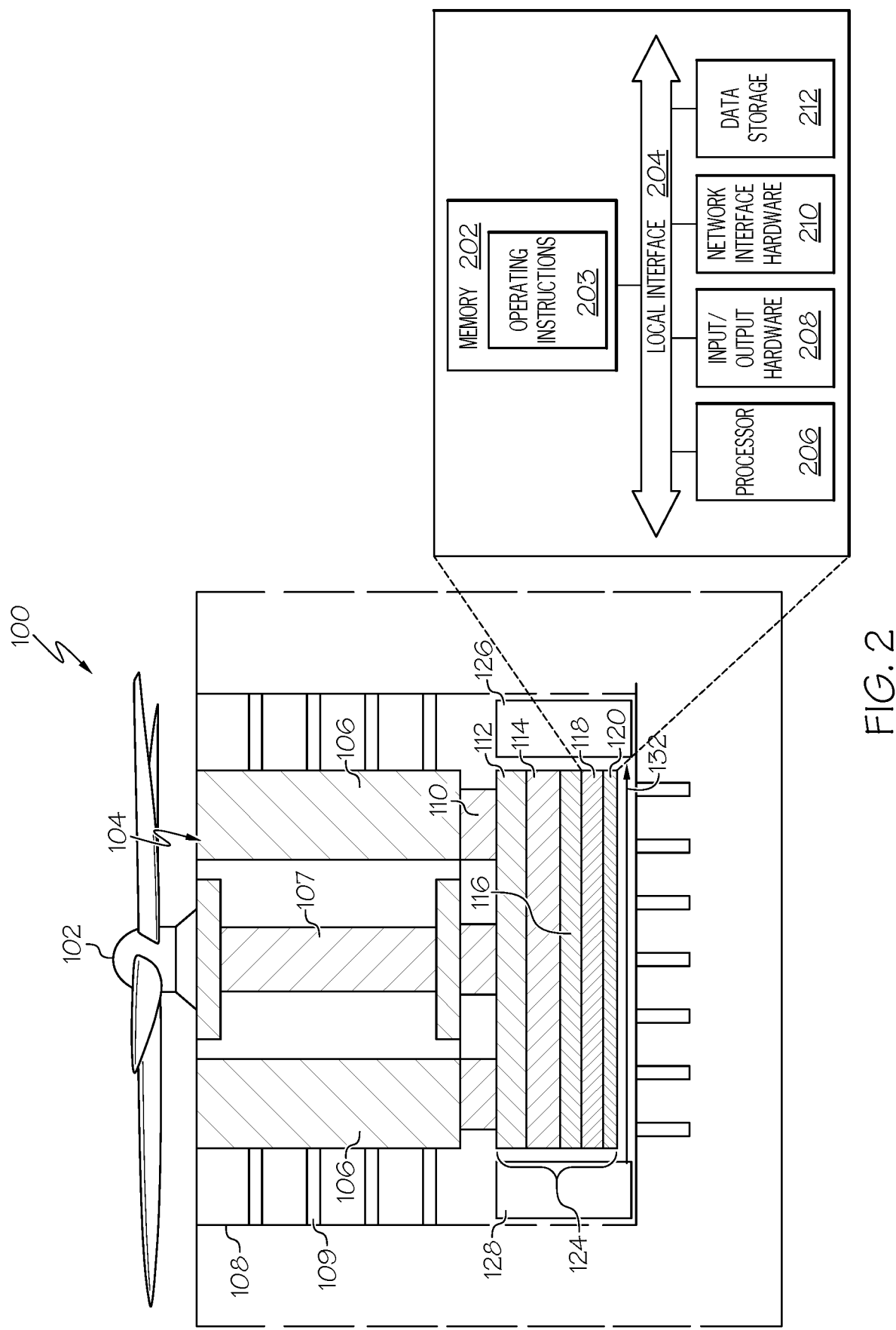
FIG. 2 depicts a non-limiting example of the controller that is configured to perform one or more of the features and functionalities described in the present disclosure, according to one or more embodiments described and illustrated herein.

FIG. 2 depicts a non-limiting example of the controller 120 that is configured to perform one or more of the features and functionalities described in the present disclosure, according to one or more embodiments described and illustrated herein. As illustrated, the controller 120 includes a processor 206, input/output hardware 208, a network interface hardware 210, a data storage component 212, and memory 202. The memory 202 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD) (whether local or cloud-based), and/or other types of non-transitory computer-readable medium. Depending on the particular embodiment, these non-transitory computer-readable media may reside within the computing device and/or a device that is external to the controller 120.

The memory 202 may store operating instructions 203, each of which may be embodied as a computer program, firmware, and so forth. The memory 202 may comprise RAM, ROM, flash memories, hard drives, or any device capable of storing the operating instructions 203 such that the operating instructions 203 can be accessed by the processor 206. The operating instructions 203 may comprise logic or algorithm(s) written in any programming language of any generation (e.g., 1GL, 2GL, 3GL, 4GL, or 5GL) such as, for example, machine language that may be directly executed by the processor, or assembly language, object-oriented programming (OOP), scripting languages, microcode, etc., that may be compiled or assembled into machine readable and executable instructions and stored on the memory 202. Alternatively, the operating instructions 203 may be written in a hardware description language (HDL), such as logic implemented via either a field-programmable gate array (FPGA) configuration or an application-specific integrated circuit (ASIC), or their equivalents. Accordingly, the methods described herein may be implemented in any conventional computer programming language, as pre-programmed hardware elements, or as a combination of hardware and software components. The processor 206 along with the memory 202 may operate as the controller 120.

A local interface 204 is also included in FIG. 1 and may be implemented as a bus or other communication interface to facilitate communication among the components of the controller 120. The processor 206 may include any processing component operable to receive and execute operating instructions 203 from the memory 202 (such as from a data storage component 212 and/or the memory 202). Accordingly, the 206 may be an integrated circuit, a microchip, a computer, or any other computing device.

The operating instructions 203 may include an operating system and/or other software for managing components of the controller 120. It should be understood that while the component in FIG. 1 are illustrated as residing within the controller 120, this is merely an example. In some embodiments, one or more of the components may reside external to the controller 120 or within other devices. It should be understood that, while the controller 120 is illustrated as a single device, this is also merely an example. As an example, one or more of the functionalities and/or components described herein may be provided by the controller 120. Depending on the particular embodiments, any of these device may have similar components as those depicted in FIG. 1. To this end, any of these devices may include instructions for performing the functionality described herein.

It should now be understood that the embodiments of the present disclosure are directed to a hybrid cooling system of an electronic machine. The hybrid cooling system includes a propeller assembly comprising a propeller, and a housing comprising a stator and a rotor coupled to the propeller, and one or more capacitors, a gate drive electronics board, a cold plate, a substrate, power electronics coupled to substrate and the cold plate, a pump for pumping liquid coolant, and a heat exchanger. The liquid coolant from the pump contacts the gate drive electronics board, the cold plate, the substrate, and the power electronics for cooling the gate drive electronics board, the cold plate, the substrate, and the power electronics. In another embodiment, another hybrid cooling system including a propeller assembly is contemplated. The propeller assembly comprises a propeller, and a housing comprising a stator and a rotor coupled to the propeller, one or more capacitors, a gate drive electronics board, a cold plate, a substrate, power electronics coupled to substrate and the cold plate, a pump for pumping liquid coolant, and a heat exchanger. The liquid coolant from the pump contacts the gate drive electronics board, the cold plate, the substrate, and the power electronics for cooling the gate drive electronics board, the cold plate, the substrate, and the power electronics, and the propeller is configured to generate air that cools the stator and the rotor.

In a first aspect, a propeller assembly of a electric machine comprising a propeller, a housing comprising a stator and a rotor coupled to the propeller, and one or more capacitors, a gate drive electronics board, a cold plate, a substrate, power electronics coupled to substrate and the cold plate, a pump for pumping liquid coolant, and a heat exchanger, and the liquid coolant from the pump contacts the gate drive electronics board, the cold plate, the substrate, and the power electronics for cooling the gate drive electronics board, the cold plate, the substrate, and the power electronics.

In a second aspect, the propeller assembly of the electric machine of the first aspect, wherein the heat exchanger is positioned on a side of the cold plate and the pump is positioned on another side of the cold plate.

In a third aspect, the propeller assembly of the electric machine of the first aspect or the second aspect, wherein the liquid coolant transforms into a heated liquid after contacting the gate drive electronics board, the cold plate, the substrate, and the power electronics.

In a fourth aspect, the propeller assembly of the electric machine of the third aspect, wherein the propeller is configured to generate air that cools the heated liquid.

In a fifth aspect, the propeller assembly of the electric machine of any of the first to the fourth aspects, wherein the liquid coolant transforms into a heated liquid after contacting the gate drive electronics board, the cold plate, the substrate, and the power electronics, and the propeller generates air that cools the heated liquid, wherein the heated liquid, which is cooled, enters the heat exchanger.

In a sixth aspect, the propeller assembly of the electric machine of the fifth aspect, wherein the heated liquid that is cooled by the air generated by the propeller and discharged from the propeller by the heat exchanger is channeled into the pump.

In a seventh aspect, the propeller assembly of the electric machine of any of the first to the sixth aspects, wherein the propeller is configured to generate air that cools the stator and the rotor.

In an eight aspect, the propeller assembly of the electric machine of the eighth aspect, wherein the air that cools the stator and the rotor contacts fins positioned within the housing.

In a ninth aspect, a propeller assembly of a electric machine comprising a propeller, a housing comprising, a stator and a rotor coupled to the propeller, and one or more capacitors, a gate drive electronics board, a cold plate, a substrate, power electronics coupled to substrate and the cold plate, a pump for pumping liquid coolant, and a heat exchanger, the liquid coolant from the pump contacts the gate drive electronics board, the cold plate, the substrate, and the power electronics for cooling the gate drive electronics board, the cold plate, the substrate, and the power electronics, and the propeller is configured to generate air that cools the stator and the rotor.

In the tenth aspect, the propeller assembly of the electric machine of the ninth aspect, wherein the heat exchanger is positioned on a side of the cold plate and the pump is positioned on another side of the cold plate.

In the eleventh aspect, the propeller assembly of the electric machine of the ninth or the tenth aspect, wherein the liquid coolant transforms into a heated liquid after contacting the gate drive electronics board, the cold plate, the substrate, and the power electronics.

In the twelfth aspect, the propeller assembly of the ninth to the eleventh aspects, wherein the propeller is configured to generate air that cools the heated liquid.

In the thirteenth aspect, the propeller assembly of any of the ninth to the twelfth aspects, wherein the liquid coolant transforms into a heated liquid after contacting the gate drive electronics board, the cold plate, the substrate, and the power electronics, and the propeller generates air that cools the heated liquid, wherein the heated liquid, which is cooled, enters the heat exchanger.

In a fourteenth aspect, the propeller assembly of the electric machine of the thirteenth aspect, wherein the heated liquid that is cooled is discharged from the propeller assembly by the heat exchanger.

In a fifteenth aspect, the propeller assembly of the electric machine of the thirteenth aspect, wherein the heated liquid that is cooled by the air generated by the propeller and discharged from the propeller by the heat exchanges is channeled into the pump.

In a sixteenth aspect, the propeller assembly of the electric machine of any of the ninth to the fifteenth aspects, wherein the propeller is configured to generate air that cools the stator and the rotor.

In a seventeenth aspect, the propeller assembly of any of the ninth to the sixteenth aspects, wherein the air that cools the stator and the rotor contacts fins positioned within the housing.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A propeller assembly of an electric machine comprising:
   a propeller;
   a housing comprising:
      a stator and a rotor coupled to the propeller; and
      one or more capacitors, a gate drive electronics board, a cold plate, a substrate, power electronics coupled to the substrate and the cold plate, a pump for pumping liquid coolant, and a heat exchanger,
   wherein:
      the heat exchanger is positioned on a side of the cold plate and the pump is positioned on another side of the cold plate, and
      the liquid coolant from the pump contacts the gate drive electronics board, the cold plate, the substrate, and the power electronics for cooling the gate drive electronics board, the cold plate, the substrate, and the power electronics.

2. The propeller assembly of the electric machine of claim 1, wherein the liquid coolant transforms into a heated liquid after contacting the gate drive electronics board, the cold plate, the substrate, and the power electronics.

3. The propeller assembly of the electric machine of claim 2, wherein the propeller is configured to generate air that cools the heated liquid.

4. The propeller assembly of the electric machine of claim 1, wherein
   the liquid coolant transforms into a heated liquid after contacting the gate drive electronics board, the cold plate, the substrate, and the power electronics; and
   the propeller generates air that cools the heated liquid, wherein the heated liquid, which is cooled, enters the heat exchanger.

5. The propeller assembly of claim 4, wherein the heated liquid that is cooled by the air generated by the propeller and discharged from the propeller by the heat exchanger is channeled into the pump.

6. The propeller assembly of the electric machine of claim 1, wherein the propeller is configured to generate air that cools the stator and the rotor.

7. The propeller assembly of the electric machine of claim 6, wherein the air that cools the stator and the rotor contacts fins positioned within the housing.

8. A propeller assembly of an electric machine comprising:
   a propeller;
   a housing comprising:
      a stator and a rotor coupled to the propeller; and
      one or more capacitors, a gate drive electronics board, a cold plate, a substrate, power electronics coupled to the substrate and the cold plate, a pump for pumping liquid coolant, and a heat exchanger,
   wherein:
      the liquid coolant from the pump contacts the gate drive electronics board, the cold plate, the substrate, and the power electronics for cooling the gate drive electronics board, the cold plate, the substrate, and the power electronics; and
      the propeller is configured to generate air that cools the stator and the rotor by contacting fins positioned within the housing.

9. The propeller assembly of the electric machine of claim 8, wherein the heat exchanger is positioned on a side of the cold plate and the pump is positioned on another side of the cold plate.

10. The propeller assembly of the electric machine of claim 8, wherein the liquid coolant transforms into a heated liquid after contacting the gate drive electronics board, the cold plate, the substrate, and the power electronics.

11. The propeller assembly of the electric machine of claim 10, wherein the propeller is configured to generate air that cools the heated liquid.

12. The propeller assembly of the electric machine of claim 8, wherein
   the liquid coolant transforms into a heated liquid after contacting the gate drive electronics board, the cold plate, the substrate, and the power electronics; and
   the propeller generates air that cools the heated liquid, wherein the heated liquid, which is cooled, enters the heat exchanger.

13. The propeller assembly of the electric machine of claim 12, wherein the heated liquid that is cooled is discharged from the propeller assembly by the heat exchanger.

14. The propeller assembly of the electric machine of claim 12, wherein the heated liquid that is cooled by the air generated by the propeller and discharged from the propeller by the heat exchanges is channeled into the pump.

15. The propeller assembly of the electric machine of claim 8, wherein the propeller is configured to generate air that cools the stator and the rotor.

* * * * *